US012684900B2

(12) United States Patent
Takao et al.

(10) Patent No.: US 12,684,900 B2
(45) Date of Patent: Jul. 14, 2026

(54) METHOD FOR MANUFACTURING NITRIDE SEMICONDUCTOR LIGHT-EMITTING ELEMENT

(71) Applicant: NIKKISO CO., LTD., Tokyo (JP)

(72) Inventors: Kazufumi Takao, Ishikawa (JP); Yusuke Matsukura, Ishikawa (JP); Cyril Pernot, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 392 days.

(21) Appl. No.: 18/545,444

(22) Filed: Dec. 19, 2023

(65) Prior Publication Data

US 2024/0213402 A1 Jun. 27, 2024

(30) Foreign Application Priority Data

Dec. 23, 2022 (JP) ................................. 2022-207327

(51) Int. Cl.
H10H 20/812 (2025.01)
H10H 20/01 (2025.01)

(52) U.S. Cl.
CPC ...... H10H 20/812 (2025.01); H10H 20/0137 (2025.01)

(58) Field of Classification Search
CPC ............. H10H 20/812; H10H 20/0137; H10H 20/01335; H10H 20/8215; H10H 20/8252; H10D 62/60; H10P 32/171; H10P 95/92
See application file for complete search history.

(56) References Cited

U.S. PATENT DOCUMENTS 11,616,167 B2 3/2023 Pernot et al.
2006/0011946 A1* 1/2006 Toda ................... H01S 5/32341
257/202

(Continued)

FOREIGN PATENT DOCUMENTS

JP 2015-26659 A 2/2015
JP 2019-54122 A 4/2019
(Continued)

OTHER PUBLICATIONS

Office Action dated Sep. 10, 2024 received from the Taiwanese Patent Office in related TW 112147571 together with English translation.

*Primary Examiner* — Calvin Y Choi
(74) *Attorney, Agent, or Firm* — Scully, Scott, Murphy & Presser, P.C.

(57) ABSTRACT

Manufacturing a nitride semiconductor light-emitting device includes a depositing an n-type cladding layer and an active layer with a multi-quantum well structure having a plurality of well layers on a substrate in a chamber. In depositing the active layer, a silicon source is not supplied into the chamber. The method includes supplying the silicon source into the chamber after depositing the n-type cladding layer and before depositing the active layer thereby, when a well layer located second from the n-type cladding layer side among the plurality of well layers is defined as a second well layer, a peak of distribution of a silicon concentration in a stacking direction of the n-type cladding layer and the active layer appears in a range where the second well layer is formed, and the silicon concentration at an apex of the peak is not less than $1.49 \times 10^{18}$ atoms/cm$^3$ and not more than $4.96 \times 10^{18}$ atoms/cm$^3$.

6 Claims, 5 Drawing Sheets

(56)                    References Cited

U.S. PATENT DOCUMENTS

2020/0227590  A1      7/2020  Pernot et al.
2022/0131042  A1*    4/2022  Matsukura ....... H10H 20/01335

FOREIGN PATENT DOCUMENTS

TW           202046513  A     12/2020
TW           202232785  A      8/2022

* cited by examiner

622

P2

L

622

P2

L

1

METHOD FOR MANUFACTURING NITRIDE SEMICONDUCTOR LIGHT-EMITTING ELEMENT

CROSS-REFERENCE TO RELATED APPLICATIONS

The present application is based on Japanese patent application No. 2022-207327 filed on Dec. 23, 2022, the entire contents of which are incorporated herein by reference.

TECHNICAL FIELD

The present invention relates to a method for manufacturing a nitride semiconductor light-emitting element.

BACKGROUND OF THE INVENTION

Patent Literature 1 discloses a nitride semiconductor light-emitting element having a multi quantum well (MQW) structure including plural well layers. In the nitride semiconductor light-emitting element described in Patent Literature 1, a trigger layer containing silicon is formed between an n-type cladding layer and a barrier layer to improve light output.

Citation List Patent Literature 1: JP2019-54122A

SUMMARY OF THE INVENTION

In case of the nitride semiconductor light-emitting element described in Patent Literature 1, however, there is room for further improvement in terms of improving light output.

The invention was made in view of such circumstances and it is an object of the invention to provide a method for manufacturing a nitride semiconductor light-emitting element that can improve light output.

To achieve the object described above, the invention provides a method for manufacturing a nitride semiconductor light-emitting element, comprising:

depositing an n-type cladding layer and an active layer with a multi-quantum well structure comprising a plurality of well layers on a substrate in a chamber, wherein a silicon source is not supplied into the chamber in the depositing the active layer, and wherein the method further comprises supplying the silicon source into the chamber after depositing the n-type cladding layer and before depositing the active layer so that, when a well layer located second from the n-type cladding layer side among the plurality of well layers is defined as a second well layer, a peak of distribution of a silicon concentration in a stacking direction of the n-type cladding layer and the active layer appears in a range where the second well layer is formed, and the silicon concentration at an apex of the peak is not less than $1.49 \times 10^{18}$ atoms/cm$^3$ and not more than $4.96 \times 10^{18}$ atoms/cm$^3$.

Advantageous Effects of the Invention

According to the invention, it is possible to provide a method for manufacturing a nitride semiconductor light-emitting element that can improve light output.

2

Figure 2:
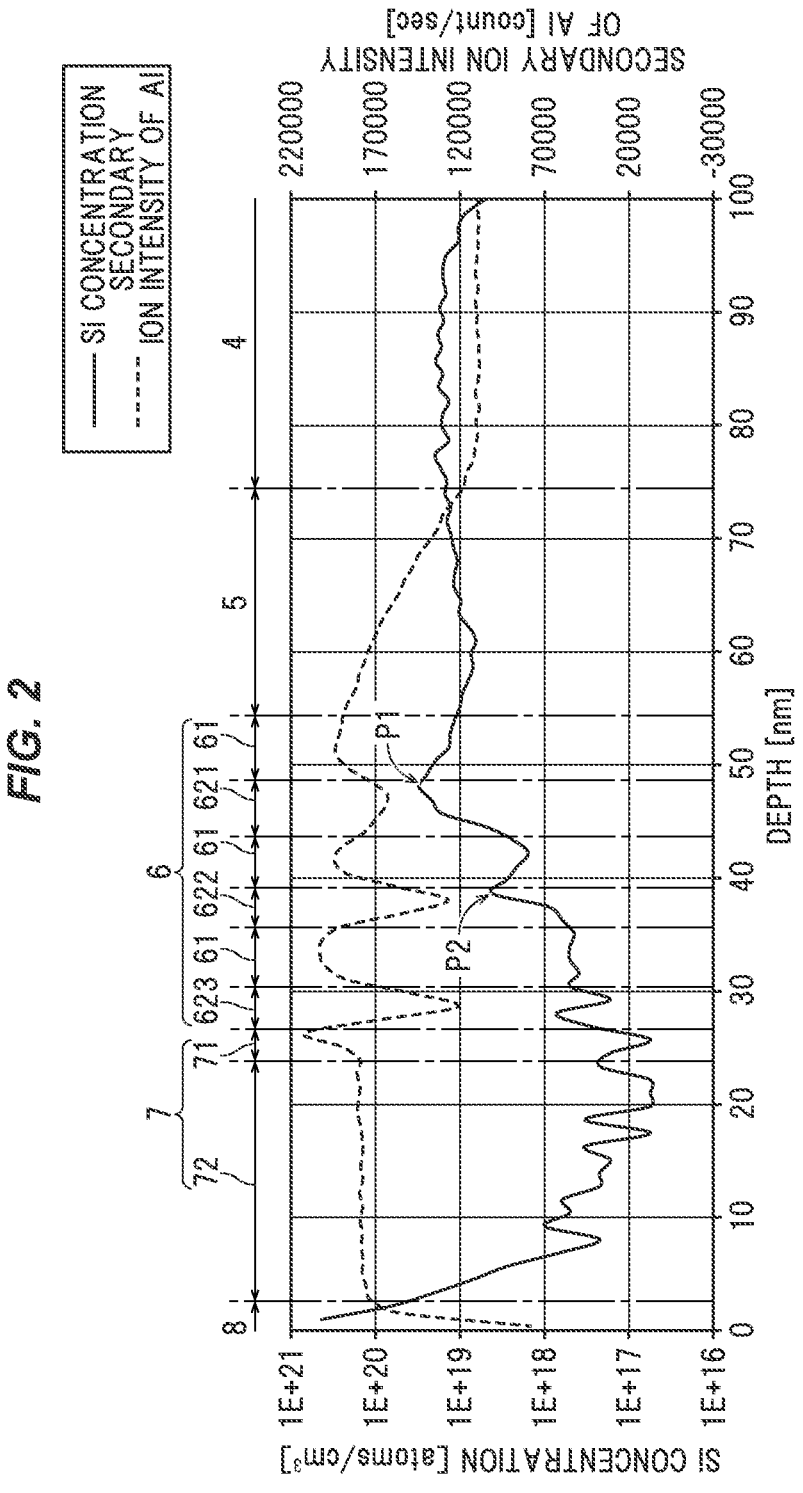

FIG. 2 is a graph showing silicon concentration distribution and secondary ion intensity distribution of Al in the nitride semiconductor light-emitting element in the embodiment.

Figures 3A, 3B:
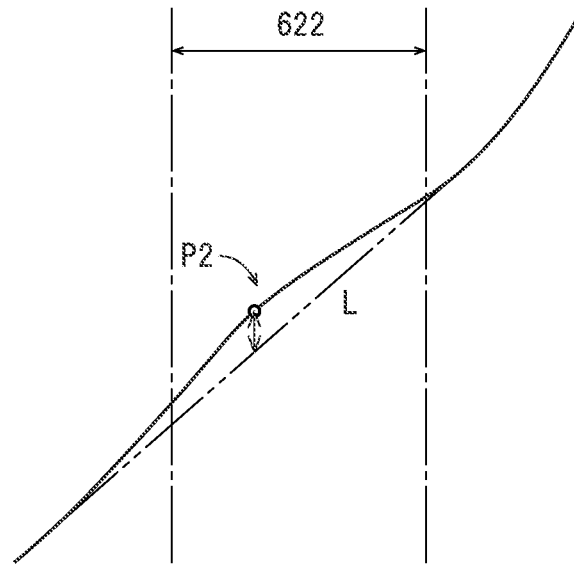

FIG. 3A is an enlarged view of the vicinity of a second peak in FIG. 2.

FIG. 3B is an enlarged view of the vicinity of the second peak of a different silicon concentration distribution from that in FIG. 2.

Figure 4:
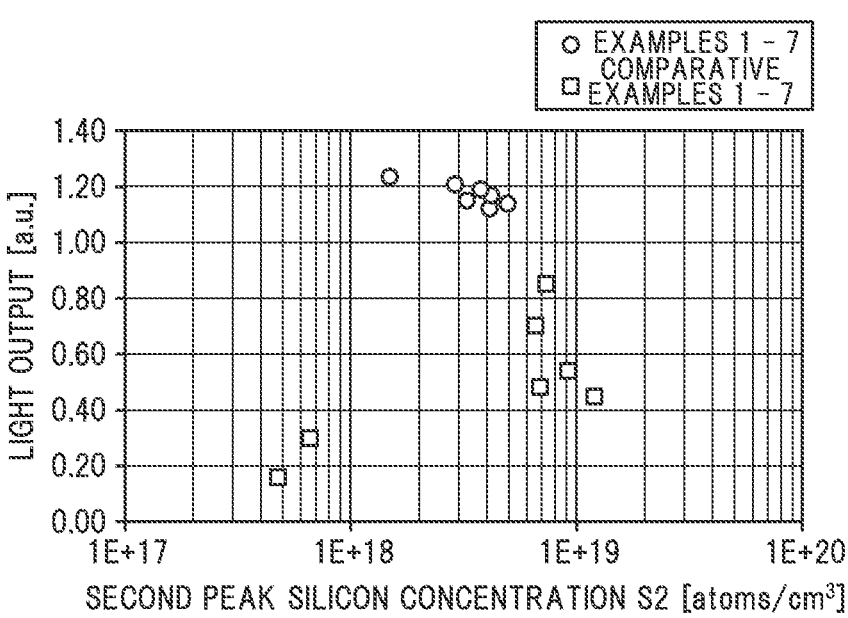

FIG. 4 is a graph showing a relationship between second peak silicon concentration and light output in Experimental Example 1.

Figure 5:
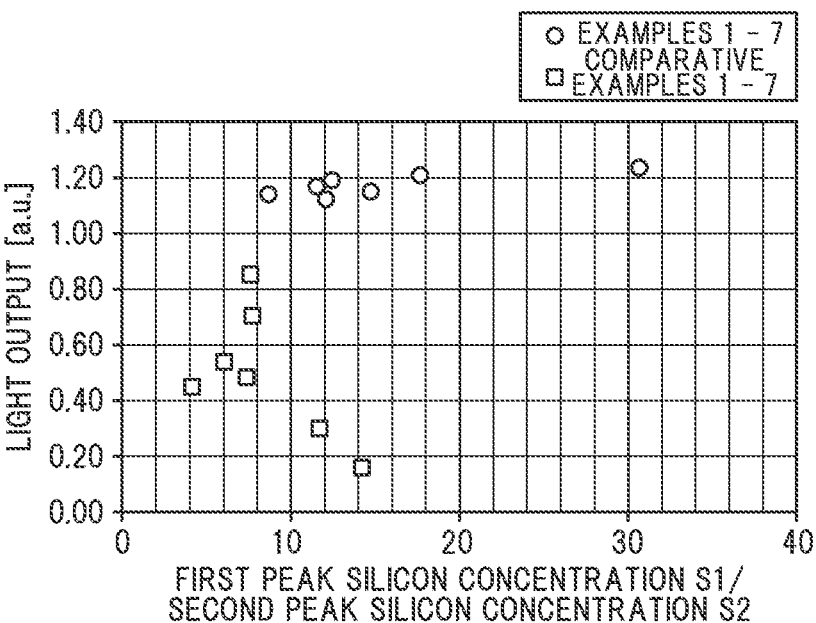

FIG. 5 is a graph showing a relationship between first peak silicon concentration S1/second peak silicon concentration S2 and light output in Experimental Example 1.

Figure 6:
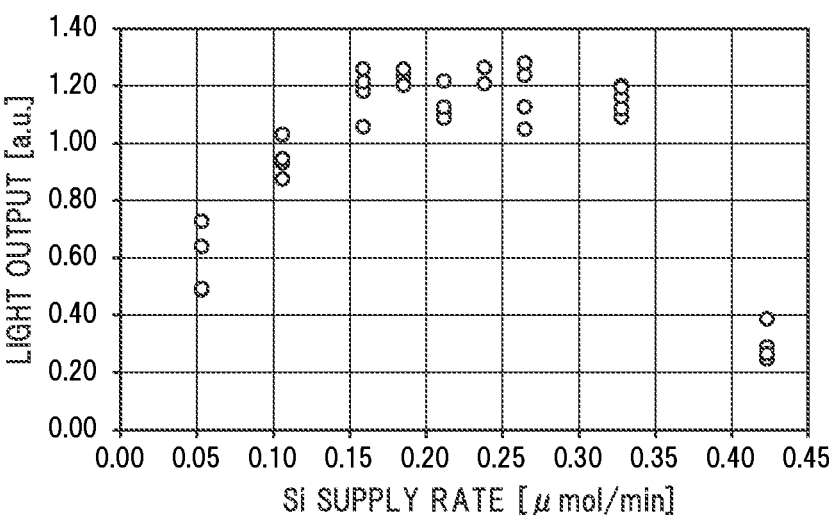

FIG. 6 is a graph showing a relationship between silicon supply rate in a silicon source supply step and light output in Experimental Example 2.

DETAILED DESCRIPTION OF THE INVENTION

Embodiment

An embodiment of the invention will be described in reference to FIGS. 1 to 3. The embodiment below is described as a preferred illustrative example for implementing the invention. Although some part of the embodiment specifically illustrates various technically preferable matters, the technical scope of the invention is not limited to such specific aspects.

Nitride Semiconductor Light-Emitting Element 1

Figure 1:
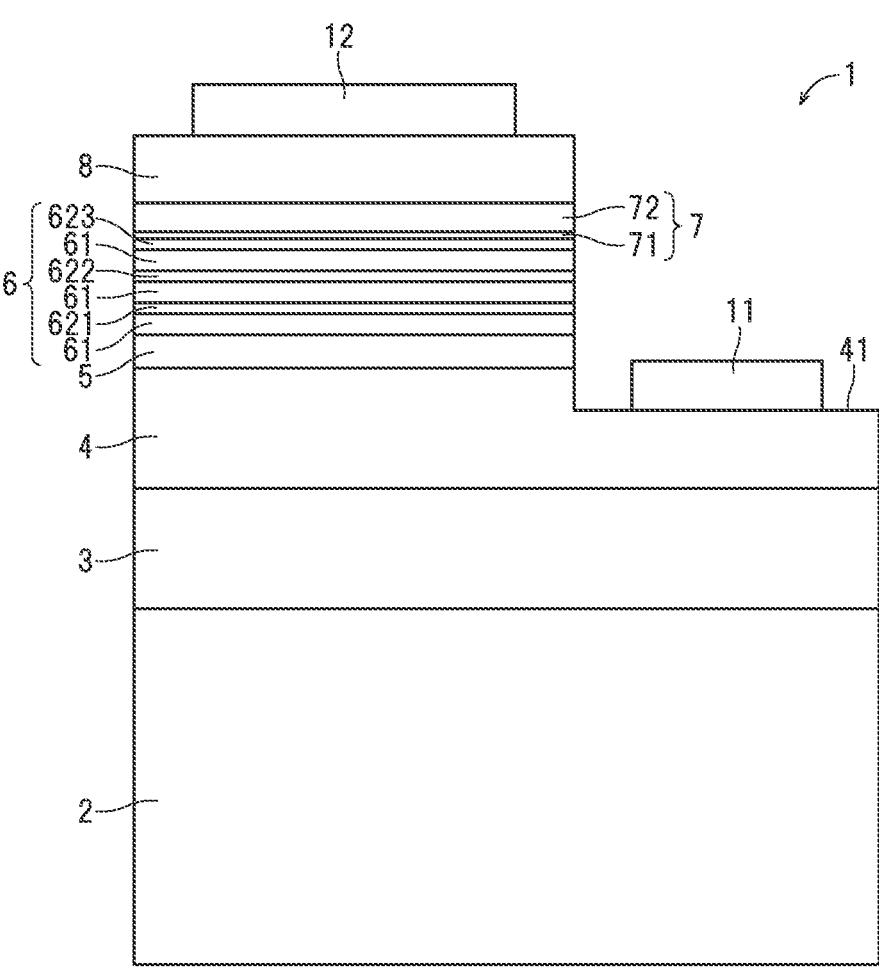
FIG. 1 is a schematic diagram illustrating a configuration of a nitride semiconductor light-emitting element in an embodiment.

FIG. 1 is a schematic diagram illustrating a configuration of a nitride semiconductor light-emitting element 1. In FIG. 1, the scale ratio in a direction of stacking each layer of the nitride semiconductor light-emitting element 1 (hereinafter, also simply referred to as "the light-emitting element 1") is not necessarily the same as the actual scale ratio. Hereinafter, the direction of stacking each layer of the light-emitting element 1 is simply referred to as the stacking direction. In addition, one side in the stacking direction, which is a side of a substrate 2 where each semiconductor layer is grown, (e.g., an upper side in FIG. 1) will be referred to as the upper side, and the opposite side (e.g., a lower side in FIG. 1) will be referred to as the lower side. In this regard, the terms "upper" and "lower" are used for descriptive purposes and do not limit the posture of the light-emitting element 1 with respect to the vertical direction when, e.g., the light-emitting element is used.

The light-emitting element 1 constitutes, e.g., a light-emitting diode (LED) or a semiconductor laser (LD: laser diode). In the present embodiment, the light-emitting element 1 constitutes a light-emitting diode that emits light with a wavelength in an ultraviolet region. Particularly, the light-emitting element 1 in the present embodiment emits ultraviolet light at a central wavelength of not less than 240 nm and not more than 365 nm. The light-emitting element 1 can be used in fields such as, e.g., sterilization (e.g., air purification, water purification, etc.), medical treatment (e.g., light therapy, measurement/analysis, etc.), UV curing, etc.

The light-emitting element 1 includes a buffer layer 3, an n-type cladding layer 4, a composition gradient layer 5, an active layer 6, an electron blocking layer 7 and a p-type semiconductor layer 8 in this order on the substrate 2. The light-emitting element 1 also includes an n-side electrode 11 provided on the n-type cladding layer 4, and a p-side electrode 12 provided on the p-type semiconductor layer 8.

As semiconductors constituting the light-emitting element 1, it is possible to use, e.g., binary to quaternary group III nitride semiconductors expressed by $Al_aGa_bIn_{1-a-b}N$ ($0 \leq a \leq 1$, $0 \leq b \leq 1$, $0 < a+b \leq 1$). In the present embodiment, binary or ternary group III nitride semiconductors expressed by $Al_cGa_{1-c}N$ ($0 \leq c \leq 1$) are used as the semiconductors constituting the light-emitting element 1. These group III elements may be partially substituted with boron (B) or thallium (Tl), etc. In addition, nitrogen (N) may be partially substituted with phosphorus (P), arsenic (As), antimony (Sb) or bismuth (Bi), etc.

The substrate 2 is made of a material transparent to light emitted by the active layer 6. The substrate 2 is, e.g., a sapphire ($Al_2O_3$) substrate. An upper surface of the substrate 2 (i.e., a surface on which each semiconductor layer of the light-emitting element 1 is stacked) is a c-plane. This c-plane may have an off-angle. Alternatively, e.g., an aluminum nitride (AlN) substrate or an aluminum gallium nitride (AlGaN) substrate, etc., may be used as the substrate 2.

The buffer layer 3 is formed on the substrate 2. In the present embodiment, the buffer layer 3 is made of aluminum nitride. When the substrate 2 is an aluminum nitride substrate or an aluminum gallium nitride substrate, the buffer layer 3 may not be necessarily included. The buffer layer 3 may also include a semiconductor layer made of undoped $Al_pGa_{1-p}N$ ($0 \leq p \leq 1$) that is formed on the semiconductor layer made of aluminum nitride.

The n-type cladding layer 4 is formed on the buffer layer 3. The n-type cladding layer 4 is made of, e.g., $Al_qGa_{1-q}N$ ($0 \leq q \leq 1$) doped with an n-type impurity. In the present embodiment, silicon (Si) is used as the n-type impurity. Alternatively, germanium (Ge), selenium (Se) or tellurium (Te), etc., may be used as the n-type impurity. An Al composition ratio q of the n-type cladding layer 4 is, e.g., preferably not less than 20%, and is more preferably not less than 25% and not more than 70%. In this regard, the Al composition ratio is also called AlN mole fraction. A film thickness of the n-type cladding layer 4 can be, e.g., not less than 1 μm and not more than 4 μm. The n-type cladding layer 4 has a single layer structure in the present embodiment but may have a multilayer structure.

The composition gradient layer 5 is formed on the n-type cladding layer 4. The composition gradient layer 5 is made of $Al_rGa_{1-r}N$ ($0 \leq r \leq 1$) doped with silicon. An Al composition ratio of the composition gradient layer 5 along the stacking direction is higher as closer the active layer 6. The composition gradient layer 5 may include, e.g., a very small region in the stacking direction (e.g., a region of not more than 5% of the entire composition gradient layer 5 in the stacking direction) in which the Al composition ratio does not increase toward the active layer 6.

The Al composition ratio of an end portion of the composition gradient layer 5 on the n-type cladding layer 4 side is preferably substantially the same (e.g., a difference within 5%) as the Al composition ratio of an end portion of the n-type cladding layer 4 on the composition gradient layer 5 side. In addition, the Al composition ratio of an end portion of the composition gradient layer 5 on the active layer 6 side is preferably substantially the same (e.g., a difference within 5%) as an Al composition ratio of an end portion of the active layer 6 on the composition gradient layer 5 side. A film thickness of the composition gradient layer 5 can be set to, e.g., not less than 5 nm and not more than 50 nm.

The active layer 6 is formed on the composition gradient layer 5. The active layer 6 has a multi quantum well structure which includes plural well layers 621 to 623. A band gap of the active layer 6 is adjusted so that ultraviolet light at a central wavelength of not less than 240 nm and not more than 365 nm can be emitted. When the active layer 6 has a multi quantum well structure as in the present embodiment, the central wavelength of ultraviolet light emitted by the active layer 6 is preferably not less than 250 nm and not more than 300 nm, more preferably, not less than 260 nm and not more than 290 nm from the viewpoint of improving light output.

In the present embodiment, the active layer 6 has three barrier layers 61 and three well layers 621 to 623, and the barrier layers 61 and the well layers 621 to 623 are alternately stacked. In the active layer 6, the barrier layer 61 is located at an end on the composition gradient layer 5 side and the well layer 623 is located at an end on the electron blocking layer 7 side. In this regard, the number of barrier layers and the number of well layers 621 to 623 in the active layer 6 are not particularly limited as long as plural well layers are present.

Each barrier layer 61 is made of $Al_sGa_{1-s}N$ ($0 < s \leq 1$). An Al composition ratio of each barrier layer 61 is, e.g., not less than 75% and not more than 95%. Each barrier layer 61 has a film thickness of, e.g., not less than 2 nm and not more than 50 nm.

The well layers 621 to 623 are made of $Al_tGa_{1-t}N$ ($0 < t < 1$). An Al composition ratio t of each of the well layers 621 to 623 is smaller than the Al composition ratio s of the barrier layers 61 (i.e., $t < s$).

The three well layers 621 to 623 will be referred to as a first well layer 621, a second well layer 622, and a third well layer 623 in order from the composition gradient layer 5 side. A film thickness of the first well layer 621 is not less than 1 nm greater than a film thickness of each of the second well layer 622 and the third well layer 623, and the Al composition ratio of the first well layer 621 is not less than 2% greater than the Al composition ratio of each of the second well layer 622 and the third well layer 623.

By increasing the Al composition ratio of the first well layer 621 to higher than the Al composition ratio of each of the second well layer 622 and the third well layer 623, crystallinity of the first well layer 621 is improved. This is because the difference in the Al composition ratio between the first well layer 621 and the n-type cladding layer 4 is reduced. The improved crystallinity of the first well layer 621 improves crystallinity of each layer formed on and above the first well layer 621 in the active layer 6. As a result, carrier mobility in the active layer 6 is improved and light output is improved. Such effects are more pronounced when the first well layer 621 has a larger film thickness, but the film thickness of the first well layer 621 is designed to be not more than a predetermined value from the viewpoint of suppressing an increase in the electrical resistance value of the entire light-emitting element 1.

A difference between the film thickness of the first well layer 621 and the film thickness of each of the second well layer 622 and the third well layer 623 is preferably not less than 2 nm and not more than 4 nm. In the present embodiment, each of the second well layer 622 and the third well layer 623 has a film thickness of not less than 2 nm and not more than 4 nm and the first well layer 621 has a film thickness of not less than 4 nm and not more than 6 nm.

The Al composition ratio of the second well layer 622 is preferably not less than 5% lower than the Al composition ratio of the first well layer 621. In the present embodiment, each of the second well layer 622 and the third well layer 623 has an Al composition ratio of not less than 25% and not more than 45%, and the first well layer 621 has an Al composition ratio of not less than 35% and not more than 55%. The plural well layers 621 to 623 may be configured such that, e.g., the layer closer to the composition gradient layer 5 has a higher Al composition ratio.

Each layer of the active layer 6 contains silicon. In the present embodiment, a silicon source is not supplied during deposition of the active layer 6 as described later, and silicon present in each layer of the active layer 6 is diffused from the substrate side of to the active layer 6 in the light-emitting element 1. A silicon concentration in the barrier layers 61 is higher in the layer closer to the composition gradient layer 5, and similarly, a silicon concentration in the well layers 621 to 623 is higher in the layer closer to the composition gradient layer 5. Silicon in the active layer 6 is likely to be incorporated particularly into positions in the stacking direction at which the active layer 6 has a low Al composition ratio.

FIG. 2 shows an example of silicon concentration distribution and secondary ion intensity distribution of Al in the light-emitting element 1 in the present embodiment. Hereinafter, the term "silicon concentration distribution" means distribution, in the stacking direction, of the silicon concentration in the light-emitting element 1, and the term "secondary ion intensity distribution of Al" means distribution, in the stacking direction, of intensity of secondary ions of Al in the light-emitting element 1. The silicon concentration and the secondary ion intensity distribution of Al in FIG. 2 are data obtained using Secondary Ion Mass Spectrometry (SIMS).

In the silicon concentration distribution, a peak, which is a mountain-shaped portion of the distribution, appears in a range where the second well layer 622 is formed. Hereinafter, the peak of the silicon concentration distribution which appears in the range where the second well layer 622 is formed will be referred to as a second peak P2. As mentioned above, silicon is likely to be incorporated into positions with a low Al composition ratio in the active layer 6. Then, since a negative peak of the secondary ion intensity distribution of Al is observed in the range where the second well layer 622 is formed, the second peak P2 tends to appear in the vicinity of the position of the apex of this negative peak (i.e., in a region where the Al composition ratio is relatively low).

Two different examples of the second peak P2 are shown in FIGS. 3A and 3B. FIG. 3A is an enlarged view of the vicinity of the second peak P2 in FIG. 2. The silicon concentration at the apex of the second peak P2 will be referred to as a second peak silicon concentration S2. The apex of the second peak P2 means a point at which a height from a baseline L (see a dash-dot-dot line in FIGS. 3A and 3B) connecting two ends of the second peak P2 (i.e., a length of the vertical double-headed arrow in FIGS. 3A and 3B) is largest, among points forming the second peak P2. When the silicon concentration distribution has plural peaks in the range where the second well layer 622 is formed, a peak having the apex with the highest silicon concentration is defined as the second peak P2.

The second peak silicon concentration S2 is not less than $1.49 \times 10^{18}$ atoms/cm$^3$ and not more than $4.96 \times 10^{18}$ atoms/cm$^3$, and is more preferably not less than $1.49 \times 10^{18}$ atoms/cm$^3$ and not more than $3.00 \times 10^{18}$ atoms/cm$^3$. As shown in Experimental Example 1 (described later), light output of the light-emitting device 1 is improved by setting the second peak silicon concentration S2 to a value within the above range.

In the silicon concentration distribution, a peak is also formed in the range where the first well layer 621 is formed. Hereinafter, the peak of the silicon concentration distribution which appears in the range where the first well layer 621 is formed will be referred to as a first peak P1. In addition, the silicon concentration at the apex of the first peak P1 will be referred to as a first peak silicon concentration S1. The apex of the first peak P1 means a point at which a height from a baseline connecting two ends of the first peak P1 is largest, among points forming the first peak P1. When the silicon concentration distribution has plural peaks in the range where the first well layer 621 is formed, a peak having the apex with the highest silicon concentration is defined as the first peak P1.

From the viewpoint of improving light output of the light-emitting element 1, the first peak silicon concentration S1 is preferably not less than 7.7 times the second peak silicon concentration S2, more preferably not less than 8.7 times and not more than 30.7 times the second peak silicon concentration S2.

As described later, a silicon source supply step in which only a silicon source is supplied as a source gas into the chamber is performed between deposition of the composition gradient layer 5 and deposition of the active layer 6. At this time, since the silicon source is supplied to portions of the composition gradient layer 5 where dislocations are present, the growth mode of the matrix phase of the semiconductor layer changes and pits (e.g., so-called V-pits, not shown) are formed in the active layer 6. It is considered that since pits are formed in the active layer 6, holes are easily supplied from the p-type semiconductor layer 8 to the active layer 6 through the pits, resulting in improvement in light output of the light-emitting element 1.

The electron blocking layer 7 is formed on the active layer 6. The electron blocking layer 7 serves to improve efficiency of electron injection into the active layer 6 by suppressing occurrence of the overflow phenomenon in which electrons leak from the active layer 6 to the p-type semiconductor layer 8 side (hereinafter, also referred to as the electron blocking effect). The electron blocking layer 7 has a stacked structure in which a first layer 71 and a second layer 72 are stacked in this order from the active layer 6 side.

The first layer 71 is provided on the active layer 6. The first layer 71 is made of, e.g., $Al_uGa_{1-u}N$ ($0 < u \le 1$). An Al composition ratio u of the first layer 71 is, e.g., not less than 90% and may be 100% (i.e., the first layer 71 may be made of AlN). A film thickness of the first layer 71 is, e.g., not less than 0.5 nm and not more than 5.0 nm.

The second layer 72 is made of, e.g., $Al_vGa_{1-v}N$ ($0 < v < 1$). An Al composition ratio v of the second layer 72 is smaller than the Al composition ratio u of the first layer 71 (i.e., $v < u$) and is, e.g., not less than 70% and not more than 90%. A film thickness of the second layer 72 is larger than the film thickness of the first layer 71 and is, e.g., not less than 15 nm and not more than 100 nm.

When the first layer 71 with a relatively high Al composition ratio has an excessively large film thickness, it causes an excessive increase in the electrical resistance value of the entire light-emitting element 1 since a semiconductor layer with a higher Al composition ratio has a higher electrical resistance value. For this reason, the film thickness of the first layer 71 is preferably small to some extent. On the other hand, if the film thickness of the first layer 71 is reduced, it increases the probability that electrons pass through the first layer 71 from the active layer 6 side to the p-type semiconductor layer 8 side due to the tunnel effect. Therefore, in the light-emitting element 1 of the present embodiment, the second layer 72 is formed on the first layer 71 to suppress passage of electrons through the entire electron blocking layer 7.

Each of the first layer 71 and the second layer 72 can be an undoped layer, a layer containing an n-type impurity, a layer containing a p-type impurity, or a layer containing both an n-type impurity and a p-type impurity. Magnesium (Mg) can be used as the p-type impurity, but zinc (Zn), beryllium (Be), calcium (Ca), strontium (Sr), barium (Ba) or carbon (C), etc., may be used other than magnesium. The same applies to the other semiconductor layers containing a p-type impurity. When each electron blocking layer 7 contains an impurity, the impurity in each electron blocking layer 7 may be contained in the entire portion of each electron blocking layer 7 or may be contained in a part of each electron blocking layer 7. The electron blocking layer 7 may be composed of a single layer, or may be composed of not less than three layers, or may be omitted.

The p-type semiconductor layer 8 is formed on the electron blocking layer 7. In the present embodiment, the p-type semiconductor layer 8 is composed of a p-type contact layer. The p-type contact layer is a layer connected to the p-side electrode 12 (described later) and is made of $Al_wGa_{1-w}N$ ($0 \leq w < 1$) doped with a high concentration of a p-type impurity. The p-type semiconductor layer 8 as the p-type contact layer is configured to have a low Al composition ratio to achieve an ohmic contact with the p-side electrode 12, and from such a viewpoint, the p-type semiconductor layer 8 is preferably made of p-type gallium nitride (GaN).

The n-side electrode 11 is formed on an exposed surface 41 of the n-type cladding layer 4 which is exposed from the active layer 6 on a side opposite to the substrate 2. The n-side electrode 11 can be, e.g., a multilayered film formed by sequentially stacking titanium (Ti), aluminum, titanium and gold (Au) on the n-type cladding layer 4. When the light-emitting element 1 is flip-chip mounted as described below, the n-side electrode 11 may be composed of a material that can reflect ultraviolet light emitted by the active layer 6.

The p-side electrode 12 is formed on an upper surface of the p-type semiconductor layer 8. The p-side electrode 12 can be made of, e.g., indium tin oxide (ITO), etc. When the light-emitting element 1 is flip-chip mounted as described below, the p-side electrode 12 may be composed of a material that can reflect ultraviolet light emitted by the active layer 6.

The light-emitting element I can be used in a state of being flip-chip mounted on a package substrate (not shown). That is, the light-emitting element 1 is mounted such that a side in the stacking direction, which is a side where the n-side electrode 11 and the p-side electrode 12 are provided, faces the package substrate and each of the n-side electrode 11 and the p-side electrode 12 is attached to the package substrate via a gold bump, etc. Light from the flip-chip mounted light-emitting element 1 is extracted on the substrate 2 side. However, it is not limited thereto and the light-emitting element 1 may be mounted on the package substrate by wire bonding, etc. In addition, although the light-emitting element 1 in the present embodiment is a so-called lateral light-emitting element 1 in which both the n-side electrode 11 and the p-side electrode 12 are provided on a side of the light-emitting element 1 opposite to the substrate 2, the light-emitting element 1 is not limited thereto and may be a vertical light-emitting element. The vertical light-emitting element is a light-emitting element in which the active layer is sandwiched between the n-side electrode and the p-side electrode. In this regard, when the light-emitting element is of the vertical type, the substrate and the buffer layer are preferably removed by laser lift-off, etc.

Method for Manufacturing the Nitride Semiconductor Light-Emitting Element 1

Next, an example of a method for manufacturing the light-emitting element 1 in the present embodiment will be described.

In the present embodiment, the buffer layer 3, the n-type cladding layer 4, the composition gradient layer 5, the active layer 6, the electron blocking layer 7 and the p-type semiconductor layer 8 are epitaxially grown on the disc-shaped substrate 2 in this order by the Metal Organic Chemical Vapor Deposition (MOCVD) method. That is, in the present embodiment, the disc-shaped substrate 2 is placed in a pocket of a susceptor arranged in a chamber and each semiconductor layer is formed on the substrate 2 by introducing source gases of each layer to be formed on the substrate 2 into the chamber. The MOCVD method is sometimes called the Metal Organic Vapor Phase Epitaxy (MOVPE) method.

As the source gases to epitaxially grow each layer, it is possible to use trimethylaluminum (TMA) as an aluminum source, trimethylgallium (TMG) as a gallium source, ammonia ($NH_3$) as a nitrogen source, tetramethylsilane (TMSi) as a silicon source, and biscyclopentadienylmagnesium ($Cp_2Mg$) as a magnesium source.

In the method for manufacturing the light-emitting device 1 in the present embodiment, the silicon source is not supplied into the chamber during the deposition of the active layer 6, but is supplied into the chamber after the deposition of the n-type cladding layer 4 and before the deposition of the active layer 6. As a result, silicon is diffused into the active layer 6 from the composition gradient layer 5 side, and the active layer 6 thus contains silicon.

In the present embodiment, timings of supplying the silicone source into the chamber after the deposition of the n-type cladding layer 4 and before the deposition of the active layer 6 are during deposition of the composition gradient layer 5 and right before the deposition of the active layer 6 (i.e., after the deposition of the composition gradient layer 5 and before the deposition of the active layer 6). Right before the deposition of the active layer 6, only the silicon source is supplied as the source gas into the chamber. Hereinafter, this step will be referred to as the "silicon source supply step". In the silicon source supply step, a gas other than the source gas (e.g., a carrier gas such as hydrogen) may be introduced into the chamber as long as the gas supplied as the source gas in only the silicon source.

In the present embodiment, the silicon source is supplied into the chamber after the deposition of the n-type cladding layer 4 and before the deposition of the active layer 6 so that the second peak P2 of the silicon concentration distribution appears in the range where the second well layer 622 is formed, and the second peak silicon concentration S2 is not less than $1.49 \times 10^{18}$ atoms/cm$^3$ and not more than $4.96 \times 10^{18}$ atoms/cm$^3$ (preferably not less than $1.49 \times 10^{18}$ atoms/cm$^3$ and not more than $3.00 \times 10^{18}$ atoms/cm$^3$).

The amount of silicon diffused into the second well layer 622 depends on the amount of silicon supplied into the chamber after the deposition of the n-type cladding layer 4 and before the deposition of the active layer 6, the growth temperature of the active layer 6, and a thickness of deposited material (deposition) deposited on a portion facing a reaction space in the chamber (such as susceptor surface and chamber inner surface), etc. For example, there is a tendency that the higher the growth temperature of the active layer 6, the easier it is for silicon to diffuse into each semiconductor layer of the active layer 6. Therefore, a supply rate of the silicon source supplied into the chamber after the deposition of the n-type cladding layer 4 and before the deposition of the active layer 6 is set by taking into consideration the growth temperature of the active layer 6 and the thickness of the deposited material, etc.

In the present embodiment, it is preferable the relationship T1>T2≥T3≥T4 or T1>T2≥T3>T4 is satisfied, where T1 is the growth temperature of the n-type cladding layer 4, T2 is the growth temperature of the composition gradient layer 5, T3 is the growth temperature in the silicon source supply step, and T4 is the growth temperature of the active layer 6. More preferably, the growth temperatures T2 and T3 are equivalent to the growth temperature T4 (e.g., a difference within 10° C.). As a result, silicon in an amount suitable for improving light output is easily diffused into the active layer 6. For example, the growth temperature T1 can be not less than 1020° C. and not more than 1180° C., and the growth temperatures T2, T3 and T4 can be not less than 1000° C. and not more than 1100° C.

In the silicon source supply step, the silicon source is supplied into the chamber at a supply rate of not less than 0.10 μmol/min and not more than 0.40 μmol/min, preferably not less than 0.15 μmol/min and not more than 0.40 μmol/min. By setting the silicon supply rate in this step to a value within the above range, light output of the light-emitting element 1 is improved as shown in Experimental Example 2 described later. The other manufacturing conditions for epitaxially growing each semiconductor layer of wafer, such as growth temperature, growth pressure and growth time, etc., can be general conditions according to the configuration of each semiconductor layer.

To epitaxially grow each semiconductor layer on the substrate 2, it is also possible to use another epitaxial growth method such as the Molecular Beam Epitaxy (MBE) method or the Hydride Vapor Phase Epitaxy (HVPE) method.

After forming each semiconductor layer on the disc-shaped substrate 2, a mask is formed on a portion of the p-type semiconductor layer 8, i.e., a part other than the portion to be the exposed surface 41 of the n-type cladding layer 4. Then, the region in which the mask is not formed is removed by etching from the upper surface of the p-type semiconductor layer 8 to the middle of the n-type cladding layer 4 in the stacking direction. The exposed surface 41 exposed toward the substrate 2 is thereby formed on the n-type cladding layer 4. After forming the exposed surface 41, the mask is removed.

Subsequently, the n-side electrode 11 is formed on the exposed surface 41 of the n-type cladding layer 4 and the p-side electrode 12 is formed on the p-type semiconductor layer 8. The n-side electrode 11 and the p-side electrode 12 may be formed by, e.g., a well-known method such as the electron beam evaporation method or the sputtering method. The object completed through the above process is cut into pieces with a desired dimension. Plural light-emitting elements 1 as shown in FIG. 1 are thereby obtained from one wafer.

Functions and Effects of the Embodiment

In the method for manufacturing the light-emitting device 1 of the present embodiment, the silicon source is not supplied into the chamber in the step of depositing the active layer 6. If the silicon source is supplied into the chamber during the deposition of the active layer 6, crystallinity of the active layer 6 degrades, which causes a decrease in light output of the light-emitting device 1 manufactured. In the present embodiment in which the silicon source is not supplied during the deposition of the active layer 6, light output of the light-emitting element 1 manufactured is improved. Furthermore, the method for manufacturing the light-emitting device 1 of the present embodiment includes the step of supplying the silicon source into the chamber after depositing the n-type cladding layer 4 and before depositing the active layer 6 so that the second peak P2 of the silicon concentration distribution appears in the range where the second well layer 622 is formed, and the second peak silicon concentration S2 is not less than $1.49 \times 10^{18}$ atoms/cm$^3$ and not more than $4.96 \times 10^{18}$ atoms/cm$^3$. It is thereby possible to manufacture the light-emitting element 1 with even higher light output. This numerical range is supported by Experimental Example 1 described later.

In addition, in the step of supplying the silicon source into the chamber after depositing the n-type cladding layer 4 and before depositing the active layer 6, the silicon source is supplied into the chamber so that the second peak silicon concentration S2 is not less than $1.49 \times 10^{18}$ atoms/cm$^3$ and less than $3.00 \times 10^{18}$ atoms/cm$^3$. It is thereby possible to manufacture the light-emitting element 1 with even higher light output. This numerical range is supported by Experimental Example 1 described later.

In addition, the growth temperature during when supplying the silicon source into the chamber after depositing the n-type cladding layer 4 and before depositing the active layer 6 is lower than the growth temperature of the n-type cladding layer 4 and not less than the growth temperature of the active layer 6. Silicon in an amount suitable for improving light output of the light-emitting element 1 is thereby easily diffused into the second well layer 622 from the composition gradient layer 5 side.

In addition, the step of supplying the silicon source into the chamber after depositing the n-type cladding layer 4 and before depositing the active layer 6 includes the silicon source supply step in which only the silicon source is supplied as a source gas into the chamber. Pits are thereby easily formed in the active layer 6, resulting in that light output of the light-emitting device 1 manufactured is improved.

In addition, in the silicon source supply step, the silicon source is supplied into the chamber at a supply rate of not less than 0.10 μmol/min and not more than 0.40 μmol/min, preferably not less than 0.15 μmol/min and not more than 0.40 μmol/min. Light output of the light-emitting element 1 manufactured is thereby improved. This numerical range is supported by Experimental Example 2 described later.

As described above, according to the present embodiment, it is possible to provide a method for manufacturing a nitride semiconductor light-emitting element that can improve light output.

Experimental Example 1

Experimental Example 1 is an example in which a relationship between the value of the second peak silicon concentration S2 in the second well layer and light output was evaluated for wafers manufactured by the manufacturing method described in the embodiment.

In this Experimental Example 1, wafers in Examples 1 to 7 and Comparative Examples 1 to 7 in which the second peak silicon concentration S2 in the second well layer was variously changed were prepared. The method for manufacturing the wafers in Examples 1 to 7 and Comparative Examples 1 to 7 is the same as that described in the embodiment, unless otherwise specified. Table 1 shows the film thickness, Al composition ratio and growth temperature of each layer of the wafers in Examples 1 to 7 and Comparative Examples 1 to 7.

TABLE 1

| | Structure | Film thickness | Al composition ratio [%] | Growth temperature [° C.] |
|---|---|---|---|---|
| | Substrate | 430 ± 25 [um] | — | — |
| | Buffer layer | 2000 ± 200 [nm] | 100 | 1200 ± 200 |
| | n-type semiconductor layer | 2000 ± 200 [nm] | 55 ± 10 | 1100 ± 80 |
| | Composition gradient layer | 15 ± 5 [nm] | 55→85 | 1050 ± 50 |
| Active | Barrier layer | 7 ± 5 [nm] | 85 ± 10 | 1050 ± 50 |
| layer | First well layer | 5 ± 1 [nm] | 45 ± 10 | 1050 ± 50 |
| (3QW) | Barrier layer | 7 ± 5 [nm] | 85 ± 10 | 1050 ± 50 |
| | Second well layer | 3 ± 1 [nm] | 35 ± 10 | 1050 ± 50 |
| | Barrier layer | 7 ± 5 [nm] | 85 ± 10 | 1050 ± 50 |
| | Third well layer | 3 ± 1 [nm] | 35 ± 10 | 1050 ± 50 |
| Electron | First layer | 1.5 ± 1 [nm] | 95 ± 5 | 1050 ± 50 |
| blocking layer | Second layer | 20 ± 10 [nm] | 80 ± 10 | 1050 ± 50 |
| | p-type semiconductor layer | 700 ± 100 [nm] | 0 | 1000 ± 100 |

The film thickness of each layer shown in Table 1 was measured by a transmission electron microscope. The Al composition ratio of each layer shown in Table 1 is a value estimated from secondary ion intensity of Al measured by secondary ion mass spectrometry. The figures in the column for Composition gradient layer in Table 1 show that the Al composition ratio of the composition gradient layer along the stacking direction changes from 55% to 85% from the n-type cladding layer side to the active layer side.

The first peak silicon concentration S1, the second peak silicon concentration S2, and the ratio S1/S2 for Examples 1 to 7 and Comparative Examples 1 to 7 are shown in Table 2 below. The silicon concentration was obtained using secondary ion mass spectrometry. Table 2 also shows light output and emission wavelength for each of Examples 1 to 7 and Comparative Examples 1 to 7.

described in the embodiment, while Comparative Examples 1 to 7 are examples in which the second peak silicon concentration S2 does not satisfy this numerical range.

In making each of Examples 1 to 7 and Comparative Examples 1 to 5, the silicon supply rate in the silicon source supply step was set to 0.33 μmol/min. The difference in the value of the second peak silicon concentration among Examples 1 to 7 and Comparative Examples 1 to 5 is due to, e.g., the difference in the film deposition environment, such as the thickness of the deposited material present in the chamber. Meanwhile, in making each of Comparative Examples 6 and 7, the active layer was deposited continuously after depositing the composition gradient layer. That is, in making each of Comparative Examples 6 and 7, the silicon source supply step was not performed.

Then, in Experimental Example 1, light output when applying a current of 20 mA in the on-wafer state was measured on each of the wafers in Examples 1 to 7 and

TABLE 2

| | First well layer First peak silicon concentration S1 [atoms/cm$^3$] | Second well layer Second peak silicon concentration S2 [atoms/cm$^3$] | S1/S2 | Light output [a.u.] | Emission wavelength [nm] |
|---|---|---|---|---|---|
| Example 1 | 5.11E+19 | 2.90E+18 | 17.7 | 1.21 | 280.2 |
| Example 2 | 4.98E+19 | 4.12E+18 | 12.1 | 1.12 | 280.2 |
| Example 3 | 4.58E+19 | 1.49E+18 | 30.7 | 1.24 | 282.6 |
| Example 4 | 4.82E+19 | 4.19E+18 | 11.5 | 1.17 | 281.0 |
| Example 5 | 4.30E+19 | 4.96E+18 | 8.7 | 1.14 | 280.2 |
| Example 6 | 4.81E+19 | 3.26E+18 | 14.7 | 1.15 | 279.4 |
| Example 7 | 4.66E+19 | 3.76E+18 | 12.4 | 1.19 | 279.4 |
| Comparative Example 1 | 5.58E+19 | 7.35E+18 | 7.6 | 0.85 | 279.4 |
| Comparative Example 2 | 4.92E+19 | 1.20E+19 | 4.1 | 0.45 | 279.4 |
| Comparative Example 3 | 5.08E+19 | 6.59E+18 | 7.7 | 0.70 | 278.6 |
| Comparative Example 4 | 5.55E+19 | 9.17E+18 | 6.0 | 0.54 | 282.6 |
| Comparative Example 5 | 5.07E+19 | 6.90E+18 | 7.3 | 0.48 | 276.0 |
| Comparative Example 6 | 6.77E+18 | 4.76E+17 | 14.2 | 0.16 | 282.0 |
| Comparative Example 7 | 7.78E+18 | 6.64E+17 | 11.7 | 0.30 | 277.0 |

As understood from Table 2, Examples 1 to 7 are examples in which the second peak silicon concentration S2 satisfies the range of not less than $1.49×10^{18}$ atoms/cm$^3$ and not more than $4.96×10^{18}$ atoms/cm$^3$ which is the range Comparative Examples 1 to 7. Measurement of light output was conducted by a photodetector placed on the substrate side of each of the wafers in Examples 1 to 7 and Comparative Examples 1 to 7. In addition, the emission wavelengths of the wafers in Examples 1 to 7 and Comparative Examples 1 to 7 were adjusted to approximately the same at around 280 nm.

First, a relationship between the second peak silicon concentration S2 and light output is shown in FIG. 4. In FIG. 4, the results in Examples 1 to 7 are plotted with circles, and the results in Comparative Examples 1 to 7 are plotted with squares.

As understood from FIG. 4, Examples 1 to 7, which are manufactured by the manufacturing method described in the embodiment and satisfy the second peak silicon concentration of not less than $1.49 \times 10^{18}$ atoms/cm$^3$ and not more than $4.96 \times 10^{18}$ atoms/cm$^3$, exhibit significantly improved light output as compared to Comparative Examples 1 to 7 which do not satisfy the above numerical range for the second peak silicon concentration. In particular, the examples in which the second peak silicon concentration satisfies not less than $1.49 \times 10^{18}$ atoms/cm$^3$ and not more than $3.00 \times 10^{18}$ atoms/cm$^3$ (Examples 1 and 3) exhibit light output of more than 1.20 [a.u.] which is extremely improved light output.

A relationship between the first peak silicon concentration S1/the second peak silicon concentration S2 and light output for each of Examples 1 to 7 and Comparative Examples 1 to 7 is shown in FIG. 5. It is shown that in each of Examples 1 to 7 which exhibit high light output, the first peak silicon concentration S1/the second peak silicon concentration S2 is not less than 7.7 (specifically, not less than 8.7 and not more than 30.7).

Experimental Example 2

Experimental Example 2 is an example in which a relationship between the silicon supply rate in the silicon source supply step and light output was evaluated.

In this Experimental Example 2, plural wafers were made according to the manufacturing method described in the embodiment. In making the plural wafers, the silicon supply rate in the silicon source supply step was variously changed. In this Experimental Example 2, the film deposition environment (e.g., the thickness of the deposited material in the chamber, etc.) when manufacturing the plural wafers was set to the same conditions as each other.

The configuration of the wafers made in Experimental Example 2 is the same as the configuration shown in Table 1 of Experimental Example 1.

Then, light output of each of the wafers made in Experimental Example 2 was measured in the same manner as in Experimental Example 1. FIG. 6 shows a relationship between the silicon supply rate in the silicon source supply step (i.e., the horizontal axis in FIG. 6) and light output.

As understood from FIG. 6, in the silicon source supply step, it is preferable to supply the silicon source into the chamber at a supply rate of not less than 0.10 μmol/min and not more than 0.40 μmol/min, from the viewpoint of improving light output. Furthermore, in the silicon source supply step, it is particularly preferable to supply the silicon source into the chamber at a supply rate of not less than 0.15 μmol/min and not more than 0.40 μmol/min (more preferably not less than 0.15 μmol/min and not more than 0.35 μmol/min), from the viewpoint of improving light output.

SUMMARY OF THE EMBODIMENT

Technical ideas understood from the embodiment will be described below citing the reference signs, etc., used for the embodiment. However, each reference sign, etc., described below is not intended to limit the constituent elements in the claims to the members, etc., specifically described in the embodiment.

The first feature of the invention is a method for manufacturing a nitride semiconductor light-emitting element 1, comprising: depositing an n-type cladding layer 4 and an active layer 6 with a multi-quantum well structure comprising a plurality of well layers 621 to 623 on a substrate in a chamber, wherein a silicon source is not supplied into the chamber in the depositing the active layer 6, and wherein the method further comprises supplying the silicon source into the chamber after depositing the n-type cladding layer 4 and before depositing the active layer 6 so that, when a well layer located second from the n-type cladding layer 4 side among the plurality of well layers 621 to 623 is defined as a second well layer 622, a peak P2 of distribution of a silicon concentration in a stacking direction of the n-type cladding layer 4 and the active layer 6 appears in a range where the second well layer 622 is formed, and the silicon concentration S2 at an apex of the peak P2 is not less than $1.49 \times 10^{18}$ atoms/cm$^3$ and not more than $4.96 \times 10^{18}$ atoms/cm$^3$.

It is thereby possible to manufacture the nitride semiconductor light-emitting element 1 with high light output.

The second feature of the invention is that, in the first feature, in the supplying the silicon source into the chamber after depositing the n-type cladding layer 4 and before depositing the active layer 6, the silicon source is supplied into the chamber so that the silicon concentration S2 at the apex of the peak P2 is not less than $1.49 \times 10^{18}$ atoms/cm$^3$ and less than $3.00 \times 10^{18}$ atoms/cm$^3$.

It is thereby possible to manufacture the nitride semiconductor light-emitting element 1 with high light output.

The third feature of the invention is that, in the first or second feature, a growth temperature during when supplying the silicon source into the chamber after depositing the n-type cladding layer 4 and before depositing the active layer 6 is lower than a growth temperature of the n-type cladding layer 4 and not less than a growth temperature of the active layer 6.

Silicon in an amount suitable for improving light output of the nitride semiconductor light-emitting element 1 is thereby easily diffused into the second well layer 622.

The fourth feature of the invention is that, in the any one of the first to third features, the supplying the silicon source into the chamber after depositing the n-type cladding layer 4 and before depositing the active layer 6 comprises supplying only the silicon source as a source gas into the chamber.

Pits are thereby easily formed in the active layer 6 and light output of the nitride semiconductor light-emitting device 1 manufactured is improved.

The fifth feature of the invention is that, in the fourth feature, in the supplying only the silicon source, the silicon source is supplied into the chamber at a supply rate of not less than 0.10 μmol/min and not more than 0.40 μmol/min.

It is thereby possible to manufacture the nitride semiconductor light-emitting element 1 with high light output.

The sixth feature of the invention is that, in the fifth feature, in the supplying only the silicon source, the silicon source is supplied into the chamber at a supply rate of not less than 0.15 μmol/min and not more than 0.40 μmol/min.

It is thereby possible to manufacture the nitride semiconductor light-emitting element 1 with high light output.

ADDITIONAL NOTE

Although the embodiment of the invention has been described, the invention according to claims is not to be limited to the embodiment described above. Further, please note that not all combinations of the features described in the embodiment are necessary to solve the problem of the invention. In addition, the invention can be appropriately modified and implemented without departing from the gist thereof.

The invention claimed is:

1. A method for manufacturing a nitride semiconductor light-emitting element, comprising:

depositing an n-type cladding layer and an active layer with a multi-quantum well structure comprising a plurality of well layers on a substrate in a chamber, wherein a silicon source is not supplied into the chamber in the depositing the active layer, and wherein the method further comprises supplying the silicon source into the chamber after depositing the n-type cladding layer and before depositing the active layer so that, when a well layer located second from the n-type cladding layer side among the plurality of well layers is defined as a second well layer, a peak of distribution of a silicon concentration in a stacking direction of the n-type cladding layer and the active layer appears in a range where the second well layer is formed, and the silicon concentration at an apex of the peak is not less than $1.49\times10^{18}$ atoms/cm$^3$ and not more than $4.96\times10^{18}$ atoms/cm$^3$.

2. The method according to claim 1, wherein in the supplying the silicon source into the chamber after depositing the n-type cladding layer and before depositing the active layer, the silicon source is supplied into the chamber so that the silicon concentration at the apex of the peak is not less than $1.49\times10^{18}$ atoms/cm$^3$ and less than $3.00\times10^{18}$ atoms/cm$^3$.

3. The method according to claim 1, wherein a growth temperature during when supplying the silicon source into the chamber after depositing the n-type cladding layer and before depositing the active layer is lower than a growth temperature of the n-type cladding layer and not less than a growth temperature of the active layer.

4. The method according to claim 1, wherein the supplying the silicon source into the chamber after depositing the n-type cladding layer and before depositing the active layer comprises supplying only the silicon source as a source gas into the chamber.

5. The method according to claim 4, wherein in the supplying only the silicon source, the silicon source is supplied into the chamber at a supply rate of not less than 0.10 μmol/min and not more than 0.40 μmol/min.

6. The method according to claim 5, wherein in the supplying only the silicon source, the silicon source is supplied into the chamber at a supply rate of not less than 0.15 μmol/min and not more than 0.40 μmol/min.

* * * * *